United States Patent [19]

Shima

[11] Patent Number: 5,528,615
[45] Date of Patent: Jun. 18, 1996

[54] SEMICONDUCTOR LASER AND METHOD OF PRODUCING THE SEMICONDUCTOR LASER

[75] Inventor: Akihiro Shima, Itami, Japan

[73] Assignee: Mitsubishi Denki Kabushiki Kaisha, Tokyo, Japan

[21] Appl. No.: 276,654

[22] Filed: Jul. 19, 1994

[30] Foreign Application Priority Data

Jul. 20, 1993 [JP] Japan .................................. 5-179315

[51] Int. Cl.$^6$ ...................................................... H01S 3/18
[52] U.S. Cl. .............................................. 372/45; 372/50
[58] Field of Search ........................................ 372/45, 50

[56] References Cited

U.S. PATENT DOCUMENTS

| 4,801,691 | 2/1989 | Scifries | 372/50 |
| 5,073,893 | 12/1991 | Kondou | 372/45 |
| 5,138,625 | 8/1992 | Paoli et al. | 372/45 |

FOREIGN PATENT DOCUMENTS 503211  3/1991  European Pat. Off. .

OTHER PUBLICATIONS

Bhat et al, "Patterned Quantum Well Heterostructures Grown By OMCVD On Non–Planar Substrates: Applications To Extremely Narrow SQW Lasers", Journal of Crystal Growth 1988, pp. 850–856.

Hamada et al, "AlGaInP Visible Laser Diodes Grown on Misoriented Substrates", IEEE Journal of Quantum Electronics, vol. 27, No. 6, 1991, pp. 1483–1490.

Primary Examiner—Rodney B. Bovernick
Assistant Examiner—Robert McNutt
Attorney, Agent, or Firm—Leydig, Voit & Mayer

[57] ABSTRACT

A semiconductor laser includes a first conductivity type semiconductor substrate having opposite first and second surfaces, a first conductivity type semiconductor layer grown on the first surface, a thin GaInP or AlGaInP active layer having a band gap energy smaller than that of the first conductivity type semiconductor layer, and a second conductivity type semiconductor layer having a band gap energy larger than that of the active layer. The first conductivity type semiconductor layer has a first crystal plane that provides a quantum wire structure of the active layer and second crystal planes disposed at opposite sides of the first crystal plane. The first crystal plane forms a first angle smaller than a prescribed angle with a {100} surface, and the second crystal plane forms a second angle larger than the first angle with the {100} surface. The active layer is grown under growth conditions that produce atoms ordered opposite {100} surface and provide the active layer in a disordering state wherein atoms opposite a surface forming an angle with the {100} surface. Therefore, a semiconductor laser including a quantum wire with improved quantum effect is realized.

14 Claims, 12 Drawing Sheets 20  21  22

21  20  22

SEMICONDUCTOR LASER AND METHOD OF PRODUCING THE SEMICONDUCTOR LASER

FIELD OF THE INVENTION

The present invention relates to a semiconductor laser and, more particularly, to production of a quantum wire structure or a quantum box structure that can reduce the oscillation threshold current of a semiconductor laser.

BACKGROUND OF THE INVENTION

FIGS. 12 to 15 are perspective views for explaining effects of quantum wire and quantum box structures described in IEEE Journal of Quantum Electronics, Vol. QE-22, No. 9, Sep. 1986, pp.1915~1921.

In FIG. 12, a GaAs bulk active layer 91 having a thickness exceeding 200Å is sandwiched by upper and lower cladding layers 92 comprising $Al_{0.2}Ga_{0.8}As$. In FIG. 13, a GaAs quantum-film active layer 93 having a thickness of 100 Å is sandwiched by upper and lower $Al_{0.2}Ga_{0.8}As$ cladding layers 92. In FIG. 14, a 100Å×100Å GaAs quantum wire 94 is buried in an $Al_{0.2}Ga_{0.8}As$ cladding layer 92. In FIG. 15, a 100Å×100Å×100Å cubic GaAs quantum box 95 is buried in an $Al_{0.2}Ga_{0.8}As$ cladding layer 92. FIG. 16 is a graph illustrating quantum effects obtained in semiconductor lasers including the bulk layer 91, the quantum film 93, the quantum wire 94, and the quantum box 95, in which the ordinate shows obtained maximum gain and the abscissa shows injected carrier concentration.

A description is given of the principle and the operation.

When an active layer serving as a light emitting region of a semiconductor laser is surrounded by a material having a band gap energy larger than that of the active layer, injected charge carriers are confined in the active layer with high efficiency. In this description, it is assumed that the difference in the band gap energies is about 0.26 eV. When the thickness of the bulk active layer 91 shown in FIG. 12 is reduced to less than 200 Å, the quantum film 93 shown in FIG. 13 is obtained. The quantum film 93 provides larger gain than the bulk layer 91 even when the concentration of carriers injected into the active layer is the same. When this quantum effect is applied to the cross direction of the quantum film 93, the quantum wire 94 shown in FIG. 14 is obtained. Further, when the quantum effect is applied to the longitudinal direction of the quantum wire, the quantum box 95 shown in FIG. 15 is obtained. FIG. 16 is a graph illustrating calculated maximum gains of semiconductor lasers including the respective active layers 91, 93, 94, and 95 at different carrier concentrations. As shown in FIG. 16, when the carrier concentration is in a range of $3\sim4\times10^{18}$ $cm^{-3}$, the maximum gain increases in the order of the bulk 91, the quantum film 93, the quantum wire 94, and the quantum box 95.

Since the oscillation threshold current of the laser decreases with an increase in the gain, the threshold current decreases in the order of the bulk 91, the quantum film 93, the quantum wire 94, and the quantum box 95 in the above-described range of the carrier concentration.

At present, semiconductor lasers employing the bulk active layer 91 and the quantum film 93 have been put to practical use. However, the quantum wire 94 and the quantum box 95 are not put to practical use because of difficulty in fabrication.

However, the quantum wire 94 has been extensively studied recently, and semiconductor lasers including quantum wires have been manufactured by way of trial.

FIG. 17 is a sectional view illustrating a semiconductor laser including a quantum wire structure disclosed in, for example, Journal of Crystal Growth 93 (1988), pp.850~856.

In the figure, reference numeral 101 designates an n type GaAs substrate having a (100) surface orientation and a [01$\bar{1}$] oriented stripe-shaped V groove 109. Reference numeral 109a designates a bottom of the groove 109. Reference numeral 109b designates inclined surfaces of the groove 109. An on type $Al_{0.5}Ga_{0.5}As$ lower cladding layer 121 having a thickness of 1.25 μm is disposed on the surface of the GaAs substrate 101 including the V groove 109. An n type $Al_xGa_{1-x}As$ lower graded cladding layer 122 having a thickness of 0.2 μm is disposed on the lower cladding layer 121, and the Al composition ratio x of the lower graded cladding layer 122 gradually decreases upward from 0.5 to 0.2. A GaAs quantum active layer 123 having a thickness of 70Å is disposed on the lower graded cladding layer 122. Reference numerals 123a and 123b designate portions of the quantum active layer 123 grown on the bottom 109a and the inclined surface 109b of the V groove 109, respectively. A p type $Al_xGa_{1-x}As$ upper graded cladding layer 124 having a thickness of 0.2 μm is disposed on the active layer 123, and the al composition ratio x of the upper graded cladding layer gradually increases upward from 0.2 to 0.5. A p type $Al_{0.5}Ga_{0.5}As$ upper cladding layer 125 having a thickness of 1.25 μm is disposed on the upper graded cladding layer 124. A p type GaAs cap layer 105 having a thickness of 0.2 μm is disposed on the upper cladding layer 125. A p side electrode 107 is disposed on the cap layer 105, and an n side electrode 108 is disposed on the rear surface of the substrate 101. Reference numeral 106 designates current blocking regions produced by proton implantation.

A description is given of the production process.

Initially, the stripe-shaped V groove 109 extending in the [01$\bar{1}$] direction is produced at the (100) surface of the n type GaAs substrate 101 using an etchant comprising $H_2SO_4$:$H_2O_2$ (30 mole %): $H_2O$ (volume ratio=1:8:40). The V groove 109 is=about 5 μm wide at the opening and about 5 μm deep.

Thereafter, the AlGaAs lower cladding layer 121, the AlGaAs lower graded cladding layer 122, the GaAs quantum active layer 123, the AlGaAs upper graded cladding layer 124, the AlGaAs upper cladding layer 125, and the GaAs cap layer 105 are successively grown on the surface of the substrate 101 having the groove 109 by MOCVD (Metal Organic Chemical Vapor Deposition). In this crystal growth, the respective growing AlGaAs layers maintain the shape of the V groove, and the portions of these layers grown on the inclined surface of the V groove are a little thicker than portions grown on the (100) surface of the substrate 101. The GaAs quantum-film active layer 123 has a relatively thick (about 100Å) crescent-shaped portion 123a opposite the bottom 109a of the V groove. On the other hand, the active layer 123b grown on the inclined surface of the groove 109b is only 70Å thick. Therefore, the active layer 123b has a band gap energy larger than that of the crescent shaped active layer 123a because of the quantum effect. In this-structure, the crescent-shaped active layer 123a is sandwiched between the upper and lower graded cladding layers 122 and 124 originally having band gap energies larger than that of the active layer 123 with respect to the perpendicular direction and, furthermore, the active layer 123a is sandwiched between the active layers 123b having band gap energies larger than that of the active layer 123a due to the difference in the thicknesses in the transverse direction, resulting in a quantum wire structure.

The difference in the band gap energies between the 100 Å thick crescent-shaped active layer 123a and the 70Å thick active layer 123b is only 0.023 eV, and this is smaller than the difference in the band gap energies between the cladding layer and the active layer, i.e., 0.26 eV, by one order of magnitude.

After the crystal growth process, proton ions are selectively implanted into the structure from the surface of the cap layer 105, excluding a region opposite the crescent-shaped active layer 123a, whereby current blocking regions 106 are produced. Thereafter, the p side electrode 107 is formed on the cap layer 105 and the n side electrode 108 is formed on the rear surface of the substrate 101 to complete the semiconductor laser shown in FIG. 18.

A description is given of the operation. When current is injected the p side electrode 107 and the n side electrode 108 which are connected to a positive electrode and a negative electrode of a current source, respectively, the injected current flows through a region opposite the bottom 109a of the V groove 109 where the current blocking regions 106 are absent and reaches into the quantum wire 123a, whereby laser oscillation occurs.

In the above-described prior art semiconductor laser, since the difference in band gap energies between the crescent-shaped active layer 123a and the active layers 123b on the inclined surfaces of the groove is very small, a satisfactory quantum effect is not obtained.

In order to improve the quantum effect, it is necessary to increase the difference in band gap energies in the transverse direction. In the prior art structure shown in FIG. 17, however, the difference in band gap energies in the transverse direction is produced utilizing the phenomenon that the active layer 123 grown in the V groove has a relatively thick portion 123a at the bottom of the groove and a relatively thin portion 123b at the inclined surface of the groove, which phenomenon is obtained under restricted conditions with little effect. Further, if the active layer 123a at the bottom of the groove is too thick, the quantum effect in the perpendicular direction is reduced. As the result, it is difficult to increase the difference in band gap energies of the active layer in the transverse direction by increasing the difference in thicknesses between the active layer 123a at the bottom of the groove and the active layer 123b on the inclined surface of the groove.

Furthermore, in the prior art structure, supposing that the same effect as described above is achieved when the stripe-shaped V groove is formed in the [011] direction, a quantum box structure can be produced by forming a reversed pyramidal recess on the substrate and growing an active layer on the substrate. In this case, however, for the same reasons as described above, it is difficult to increase the difference in band gap energies of the active layer in the transverse direction, so that a quantum box structure with improved quantum effect is not produced.

SUMMARY OF THE INVENTION

It is an object of the present invention to provide a semiconductor laser including a quantum wire or quantum box structure with improved quantum effect.

It is another object of the present invention to provide a method for fabricating the semiconductor laser.

Other objects and advantages of the invention will become apparent from the detailed description that follows.

The detailed description and specific embodiments described are provided only for illustration since various additions and modifications within the spirit and scope of the invention will be apparent to those of skill in the art from the detailed description.

According to a first aspect of the present invention, a semiconductor laser includes a first conductivity type semiconductor substrate having opposite first and second surfaces, a first conductivity type semiconductor layer disposed on the first surface of the semiconductor substrate, a thin GaInP or alGaInP active layer grown on the first conductivity type semiconductor layer and having a band gap energy smaller than that of the first conductivity type semiconductor layer, and a second conductivity type semiconductor layer disposed on the active layer and having a band gap energy larger than that of the active layer. The first conductivity type semiconductor layer has a first crystal plane that provides a quantum wire structure of the active layer and second crystal planes disposed at opposite sides of the first crystal plane. The first crystal plane forms a first angle smaller than a prescribed angle with a {100} surface, and the second crystal plane forms a second angle larger than the first angle with the {100} surface. The active layer is grown under prescribed growth conditions that provide the active layer in an ordering state wherein atoms in of the active layer are regularly ordered when the active layer is grown on the {100}surface and are disordered when the active layer is grown on a surface forming an angle with the {100} surface. Therefore, a semiconductor laser including a quantum wire with improved quantum effect is realized.

According to a second aspect of the present invention, a semiconductor laser includes a first conductivity type semiconductor substrate having opposite first and second surfaces, a first conductivity type semiconductor layer grown on the first surface of the semiconductor substrate, a thin GaInP or alGaInP active layer grown on the first conductivity type semiconductor layer and having a band gap energy smaller than that of the first conductivity type semiconductor layer, and a second conductivity type semiconductor layer disposed on the active layer and having a band gap energy larger than that of the active layer. The first conductivity type semiconductor layer has a first crystal plane that provides a quantum box structure of the active layer and second crystal planes surrounding the first crystal plane. The first crystal plane forms a first angle smaller than a prescribed angle with a {100} surface, and the second crystal plane forms a second angle larger than the first angle with the {100} surface. The active layer is grown under prescribed growth conditions wherein atoms of the active layer are regularly ordered when the active layer is grown on the {100} surface and are disordered when the active layer is grown on a surface forming an angle with the {100} surface. Therefore, a semiconductor laser including a quantum box with improved quantum effect is realized.

According to a third aspect of the present invention, in a method for producing a semiconductor laser, initially a first conductivity type semiconductor substrate having opposite first and second surfaces is prepared. Thereafter, a first conductivity type semiconductor layer is formed on the first surface of the semiconductor substrate so the semiconductor layer has a stripe-shaped first crystal plane forming a first angle smaller than a prescribed angle with a {100} surface and stripe-shaped second crystal planes disposed at opposite sides of the first crystal plane and forming a second angle larger than the first angle with the {100} surface. Then, a thin GaInP or alGaInP active layer having a band gap energy smaller than that of the first conductivity type semiconductor layer is grown on the first conductivity type semiconductor layer under prescribed growth conditions so that atoms of the active layer are regularly ordered when the active layer is grown on the {100} surface and atoms are disordered when the active layer is grown on a surface forming an angle with the {100} surface. Then, a second conductivity type semiconductor layer having a band gap energy larger than that of the active layer is grown on the active layer. Therefore, a semiconductor laser including a quantum wire with improved quantum effect is produced.

According to a fourth aspect of the present invention, in a method for producing a semiconductor laser, initially, a first conductivity type semiconductor substrate having opposite first and second surfaces is prepared, and a first conductivity type semiconductor layer is formed on the first surface of the semiconductor substrate so that the semiconductor layer has a first crystal plane forming a first angle smaller than a prescribed angle with a {100} surface and second crystal planes surrounding the first crystal plane and forming a second angle larger than the first angle with the {100} surface. Thereafter, a GaInP or alGaInP active layer having a band gap energy smaller than that of the first conductivity type semiconductor layer is grown on the first conductivity type semiconductor layer under prescribed growth conditions of the active layer are regularly ordered when the active layer is grown on the {100} surface and atoms are disordered when the active layer is grown on a surface forming an angle with the {100} surface. Then, a second conductivity type semiconductor layer having a band gap energy larger than that of the active layer is grown on the active layer. Therefore, a semiconductor laser including a quantum box with improved quantum effect is produced.

DETAILED DESCRIPTION OF THE PREFERRED EMBODIMENTS

Figure 1:
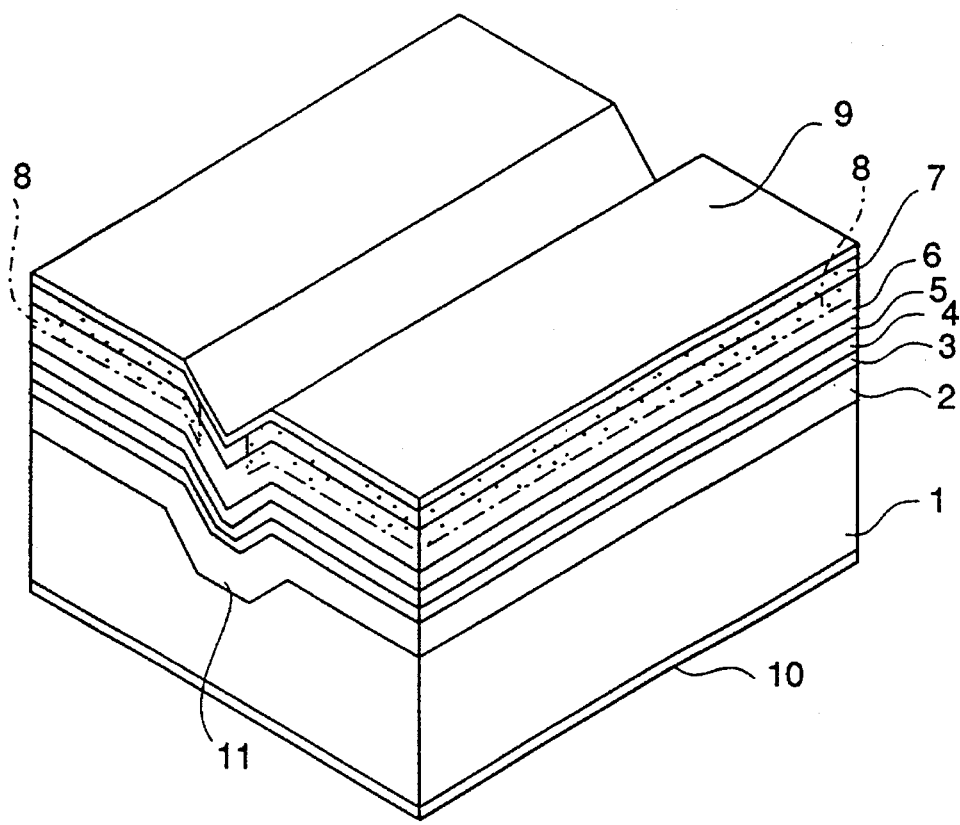
FIG. 1 is a perspective view illustrating a semiconductor laser in accordance with a first embodiment of the present invention.
Figure 2:
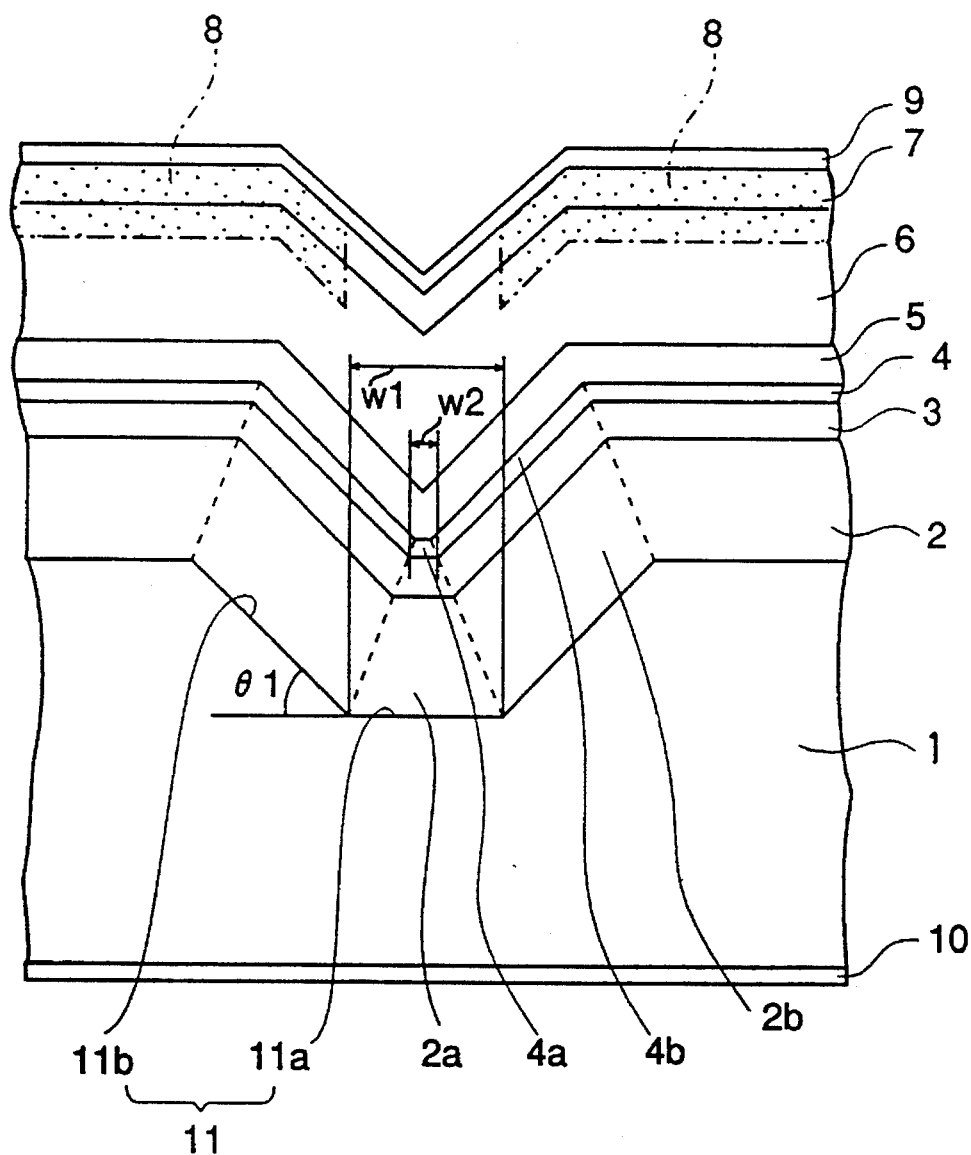
FIG. 2 is a sectional view schematically illustrating a part of the semiconductor laser of FIG. 1.

FIG. 1 is a perspective view illustrating a semiconductor laser in accordance with a first embodiment of the present invention, and FIG. 2 is a sectional view schematically illustrating a part of the semiconductor laser. In the figures, reference numeral 1 designates an n type GaAs substrate having a (100) surface orientation. The substrate 1 includes a stripe-shaped groove 11 having a reverse trapezoidal cross section and extending in the [01$\bar{1}$] direction. The groove 11 comprises a (100) oriented bottom surface 11a and inclined side surfaces 11b. The angle θ1 between the (100) surface 11a and the inclined surface 11b is 45°. An n type $(Al_{0.5}Ga_{0.5})_{0.5}In_{0.5}P$ lower cladding layer 2 having a thickness of 1 μm is disposed on the substrate 1. The lower cladding layer 2 includes a portion 2a grown on the (100) surface 11a and portions 2b grown on the inclined surfaces 11b. An n type $(Al_xGa_{1-x})_{0.5}In_{0.5}P$ lower graded cladding layer 3 having a thickness of 0.2 μm is disposed on the lower cladding layer 2, The Al composition ratio x gradually decreases upward from 0.5 to 0.2. A $Ga_{0.5}In_{0.5}P$ quantum active layer 4 having a thickness of 100Å is disposed on the lower graded cladding layer 3. The active layer 4 has a portion 4a grown on the (100) oriented bottom plane of the groove and portions 4b grown on the inclined surfaces of the groove. A p type $(Al_xGa_{1-x})_{0.5}In_{0.5}P$ upper graded cladding layer 5 is disposed on the active layer 4, and the al composition ratio x gradually increases upward from 0.2 to 0.5. A p type $(Al_{0.5}Ga_{0.5})_{0.5}In_{0.5}P$ upper cladding layer 6 having a thickness of 2 μm is disposed on the upper graded cladding layer 5. A p type GaAs contact layer 7 having a thickness of 0.2 μm is disposed on the upper cladding layer 6. A p side electrode 9 is disposed on the contact layer 7 and an n side electrode 10 is disposed on the rear surface of the substrate 1. Reference numeral 8 designates current blocking regions produced by proton implantation.

A method for fabricating the laser structure shown in FIGS. 1 and 2 is illustrated in FIGS. 3(a)–3(e). In these figures, the same reference numerals as in FIGS. 1 and 2 designate the same or corresponding parts.

Figure 3A:
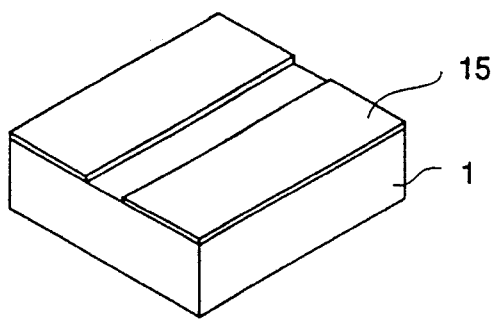
FIGS. 3(a)–3(e) are perspective views illustrating process steps in a method for fabricating the semiconductor laser of FIG. 1.

Initially, as illustrated in FIG. 3(a), a mask pattern 15 having a stripe-shaped opening extending in the [01$\bar{1}$] direction is formed on the (100) surface of the n type GaAs substrate 1.

Figure 3B:
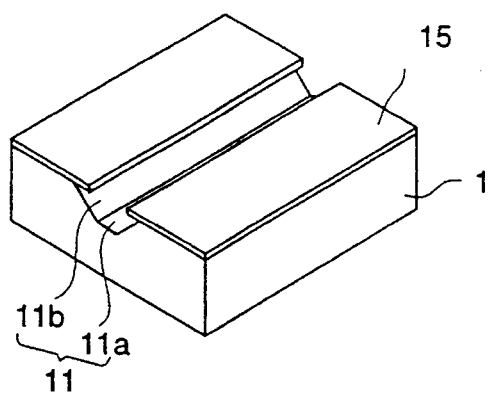

In the step of FIG. 3(b), the substrate 1 is etched with an etchant comprising $H_2SO_4 : H_2O_2$ (30 mol %) : $H_2O$ (volume ratio=8:1:1) to form the stripe-shaped groove 11 having a reverse trapezoidal cross section.

Figure 3C:
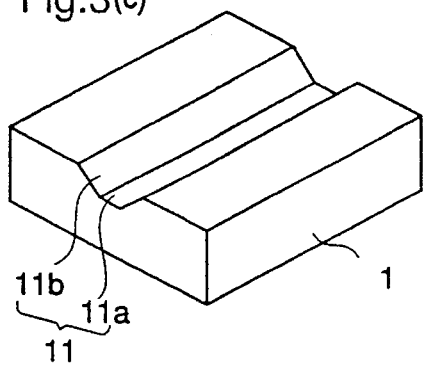
Figure 3D:
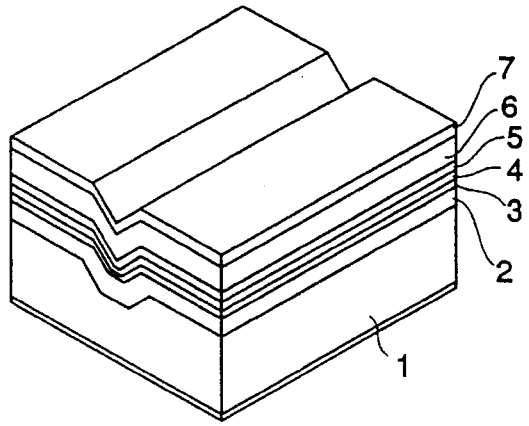

After removal of the mask pattern 15 (FIG. 3(c)), the lower cladding layer 2, the lower graded cladding layer 3, the active layer 4, the upper graded cladding layer 5, the upper cladding layer 6, and the contact layer 7 are successively grown by MOCVD (FIG. 3(d)).

Figure 3E:
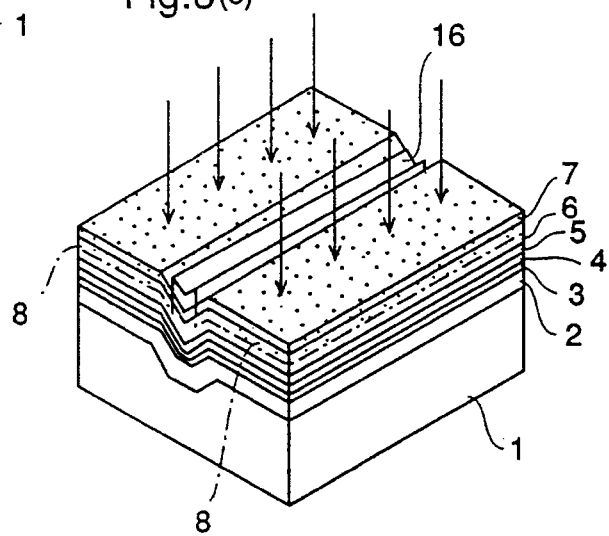

In the step of FIG. 3(e), a mask pattern 16 is formed on a part of the contact layer 7 opposite a region where a current path is produced, and protos are implanted from the surface of the contact layer 7 to produce current blocking regions 8. After removal of the mask pattern 16, a p side electrode 9 is formed on the contact layer 7 and an n side electrode 10 is formed on the rear surface of the substrate 1, completing the laser structure of FIG. 1.

Figure 6:
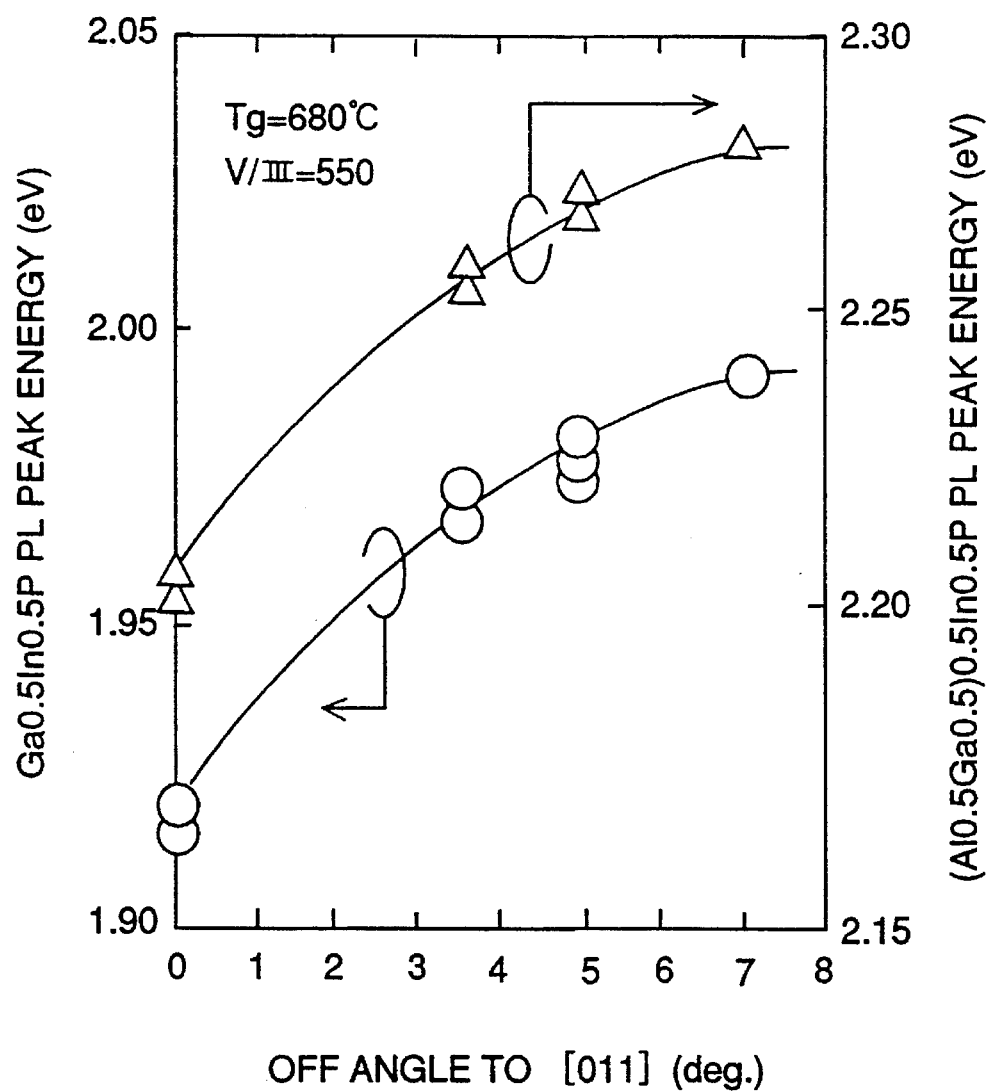
FIG. 6 is a graph illustrating relationship between PL (photoluminescence) peak energies of $Ga_{0.5}In_{0.5}P$ and $(Al_{0.5}Ga_{0.5})_{0.5}In_{0.5}P$ layers and angles toward [011] direction of GaAs substrates.

FIG. 6 is a graph illustrating the relationship between PL (photoluminescent light) peak energies of $Ga_{0.5}In_{0.5}P$ and $(Al_{0.5}Ga_{0.5})_{0.5}In_{0.5}P$ layers and angles of GaAs substrates from the (100) surface toward the [011] direction, disclosed in IEEE Journal of Quantum Electronics, Vol. 27, No. 6, June 1991, pp.1483–1489. When a $Ga_{0.5}In_{0.5}P$ layer is grown on a GaAs substrate having a (100) oriented surface (off angle=0°) and a surface forming a prescribed angle with the (100) surface (hereinafter referred to as off-angle surface) by MOCVD at a growth temperature of 680° C. and a V/III ratio of 550, a portion of that layer grown on the off-angle surface has a band gap energy larger than that of a portion grown on the (100) surface. When the off angle exceeds 7°, the difference in band gap energies between these portions exceeds 0.074 eV.

Figure 4:
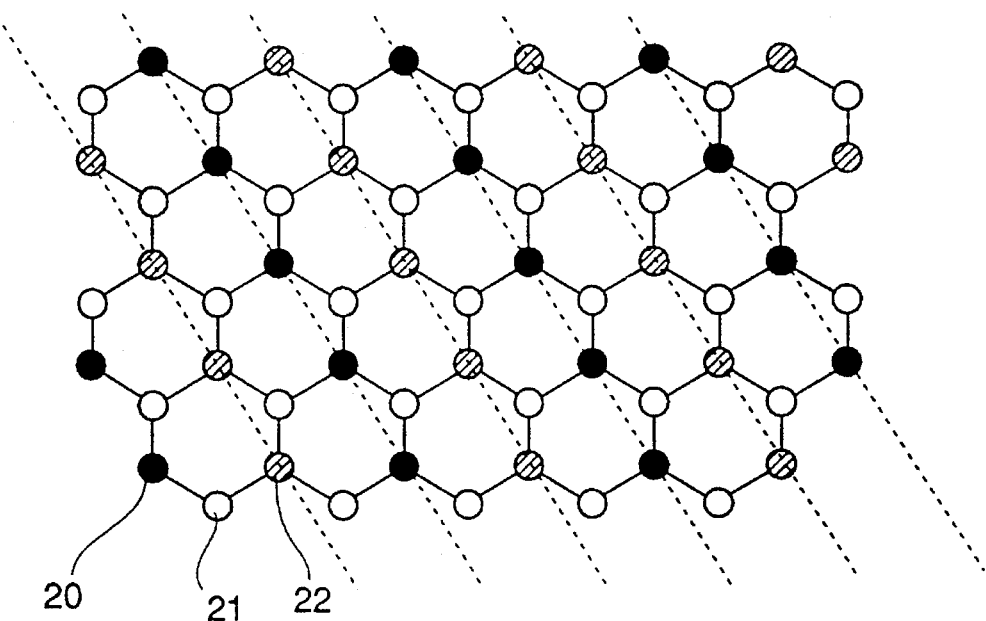
FIG. 4 is a schematic diagram illustrating a crystal structure of a GaInP layer grown on a (100) surface under prescribed growth conditions.
Figure 5:
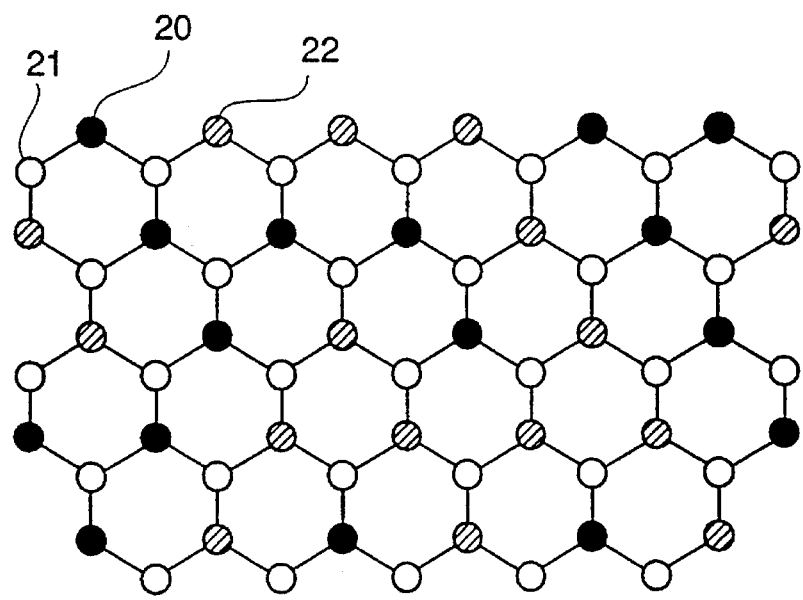
FIG. 5 is a schematic diagram the illustrating a crystal structure of a GaInP layer grown on a surface forming a prescribed angle with the (100) surface under prescribed growth conditions.

This shifting of the band gap energy is attributed to the crystal structure of the grown GaInP layer. When a GaInP layer is grown under the above-described growth conditions, the GaInP layer grown on the (100) surface has a crystal structure schematically shown in FIG. 4 in which Ga atoms 20, P atoms 21, and In atoms 22 are regularly ordered. Hereinafter, this state is called ordered state. On the other hand, the GaInP layer grown on the off-angle surface has a crystal structure schematically shown in FIG. 5 in which Ga atoms 20 and in atoms 22 are not periodically arranged, i.e., these atoms are disordered, increasing the band gap energy of the GaInP layer. Hereinafter this state is called the disordered state. The reason why the shifting of the band gap energy increases with an increase in the off angle is that the degree of the disordering increases with an increase in the off angle. The relationship between the GaInP crystal and the shifting of the band gap energy is described in more detail in Applied Physics Letters, Vol. 59, No. 9 (1989), pp. 1360–1367.

In this first embodiment of the present invention, the difference in the band gap energies in the transverse direction is increased utilizing the above-described mechanism. More specifically, the stripe-shaped groove 11 having reverse trapezoidal cross section is formed on the (100) oriented GaAs substrate 1, whereby the substrate 1 has the stripe-shaped (100) surface 11a at the bottom of the groove 11 and the 45° off-angled surfaces 11b at opposite sides of the (100) surface 11a. When crystal growth is carried out on the substrate 1 having the groove 11, under the above-described growth conditions, the alGaInP layer 2a and the GaInP layer 4a grown on the (100) surface 11a (off angle= 0°) are in the ordered state shown in FIG. 4 and the alGaInP layer 2b and the GaInP layer 4b grown on the 45° off-angled planes 11b are in the disordering state shown in FIG. 5. Therefore, in this structure, the quantum wire active layer 4a produced opposite the bottom surface 11a of the groove is sandwiched by the upper and lower graded cladding layers 5 and 3, comprising $(Al_xGa_{1-x})_{0.5}In_{0.5}P$ having a large band gap energy, in a direction perpendicular to the substrate 1. Further, the active layer 4a is sandwiched transverse to the substrate 1 by the active layers 4b grown in the disordering state and having a large band gap energy, with respect to the transverse direction. The difference in band gap energies between the quantum wire active layer 4a the active layers 4b is 0.074 eV, and about 3 times larger than that of the prior art laser device. Therefore, an improved quantum wire structure is produced, and a satisfactory quantum effect is achieved.

In the crystal growth process, the growth rate on the stripe-shaped bottom 11a of the groove is approximately equal to the growth rate on the inclined surface 11b of the groove, so that the width w2 of the (100) surface of the lower graded cladding layer 3 and the width w1 of the bottom surface of the stripe-shaped groove have the following relationship:

$$w2=w1-2 \tan \{R-(2R-\theta1)/2\}\cdot(t1+t2)$$

where t1 is the thickness of the lower cladding layer 2 and t2 is the thickness of the lower graded cladding layer 3.

Accordingly, in this first embodiment of the invention, when the width w1 of the bottom surface of the stripe-shaped groove is about 1 μm, the width w2 of the (100) surface of the lower graded cladding layer 3 is about 0.01 μm, so that the active layer 4a grown on the (100) surface has a width narrower than the 200Å that is required for a quantum wire.

In this first embodiment of the present invention, with respect to the lower cladding layer 2, the lower graded cladding layer 3, the upper graded cladding layer 5, and the upper cladding layer 6, band gap energies of these layers grown on the bottom surface of the groove are different from band gap energies of these layers grown on the inclined surface 11b. However, the differences in band gap energies do not increase the effect of the quantum wire.

Figure 7:
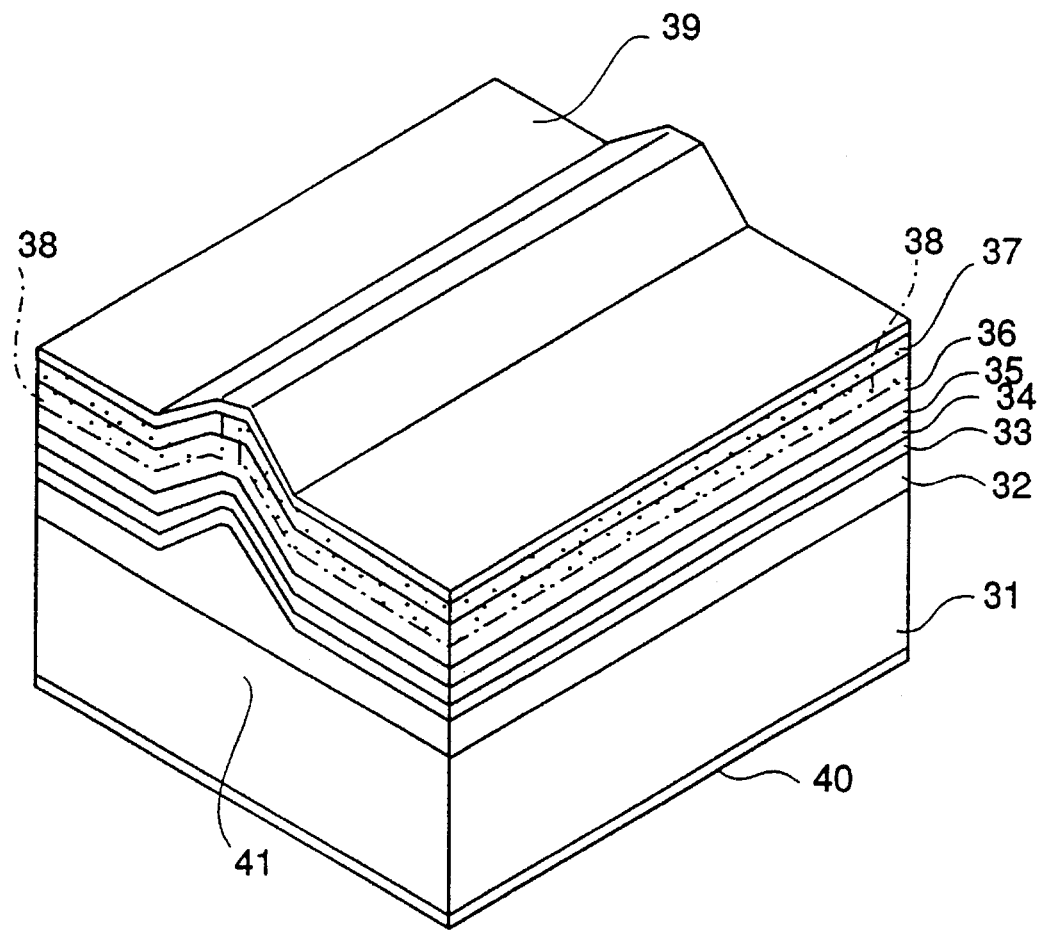
FIG. 7 is a perspective view illustrating a semiconductor laser in accordance with a second embodiment of the present invention.
Figure 8:
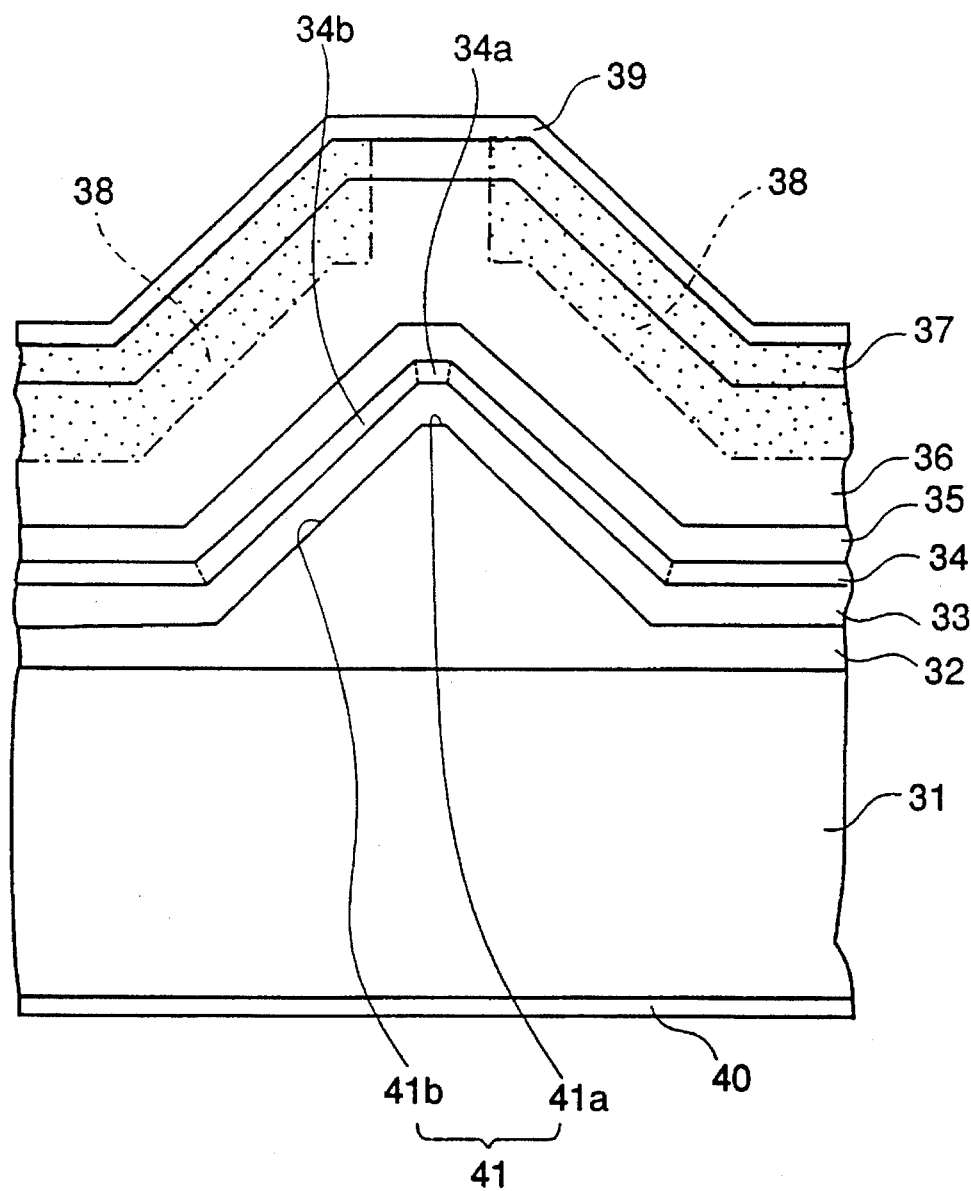
FIG. 8 is a sectional view schematically illustrating a part of the semiconductor laser shown in FIG. 7.

FIG. 7 is a perspective view illustrating a semiconductor laser in accordance with a second embodiment of the present invention, and FIG. 8 is a sectional view schematically illustrating a part of the semiconductor laser shown in FIG. 7. In these figures, reference numeral 31 designates an n type GaAs substrate having a (100) surface orientation. An n type $(Al_{0.5}Ga_{0.5})_{0.5}In_{0.5}P$ lower cladding layer 32 is disposed on the substrate 31. The lower cladding layer 32 has a stripe-shaped ridge 41 having a trapezoidal cross section and extending in the [01$\bar{1}$] direction. The stripe-shaped ridge 41 has a top (100) surface 41a and inclined surfaces 41b. The lower cladding layer 32 is 1 μm thick at the ridge 41 and 0.2 μm thick at a part other than the ridge 41. An n type $(Al_xGa_{1-x})_{0.5}In_{0.5}P$ lower graded cladding layer 33 having a thickness of 0.2 μm is disposed on the lower cladding layer 32, and the al composition ratio x gradually decreases upward from 0.5 to 0.2. A $Ga_{0.5}In_{0.5}P$ quantum-film active layer 34 having a thickness of 100Å is disposed on the lower graded cladding layer 33. The active layer 34 has a portion 34a grown on the (100) surface of the lower graded cladding layer 33 that is opposite the top (100) surface 41a of the ridge 41 and portions 34b grown on the inclined surfaces of the lower graded cladding layer 33 that are formed opposite the inclined surfaces 41b of the ridge 41. A p type $(Al_xGa_{1-x})_{0.5}In_{0.5}P$ upper graded cladding layer 35 having a thickness of 0.2 μm is disposed on the active layer 34, and the al composition ratio x gradually increases upward from 0.2 to 0.5. A p type $(Al_{0.5}Ga_{0.5})_{0.5}In_{0.5}P$ upper cladding layer 36 having a thickness of 2 μm is disposed on the upper graded cladding layer 35. A p type GaAs contact layer 37 having a thickness of 0.2 μm is disposed on the upper cladding layer 36. A p side electrode 39 is disposed on the contact layer 37, and an n side electrode 40 is disposed on the rear surface of the substrate 31. Reference numeral 38 designates current blocking regions produced by proton implantation, A description is given of the production process.

Initially, the lower cladding layer 32 having a thickness of 1 μm is grown on the (100) oriented n type GaAs substrate 31. Thereafter, a stripe-shaped mask pattern extending in the [01$\bar{1}$] direction is formed on the lower cladding layer 32. Then, the lower cladding layer 32 is selectively etched with an etchant comprising $H_2SO_4$: $H_2O$ (volume ratio=1:1) to form the stripe-shaped ridge 41 having a trapezoidal cross section. The width of the top surface 41a of the ridge is narrower than 0.01 μm. After removal of the mask pattern, the lower graded cladding layer 33, the active layer 34, the upper graded cladding layer 35, the upper cladding layer 36, and the contact layer 37 are successively grown on the lower cladding layer 32 by MOCVD. Thereafter, a stripe-shaped mask pattern is formed on a part of the contact layer 37 opposite a region where a current path is produced, and protons are implanted from the surface of the contact layer 37, forming the current blocking regions 38. After removal of the mask pattern, the p side electrode 39 is formed on the contact layer 37 and the n side electrode 40 is formed on the rear surface of the substrate 31, followed by cleaving to produce resonator facets, whereby the semiconductor laser shown in FIG. 8 is completed.

Also in this second embodiment of the invention, the active layer 34a grown on the top surface 41a of the ridge is in the ordered state and the active layers 34b grown on the inclined surfaces 41b of the ridge are in the disordered state. Therefore, as in the first embodiment of the invention, a quantum wire structure having improved carrier confinement in the transverse direction of the active layer and satisfactory quantum effect is realized.

In this second embodiment, the stripe-shaped ridge is not formed on the GaAs substrate 31 but formed on the lower cladding layer 32 grown on the substrate 31. The reason is as follows. Since the band gap energy of the GaAs substrate 31 is smaller than that of the GaInP active layer 34, if the active layer 34 and the substrate 31 are close to each other, absorption and loss of light produced in the active layer by the substrate increases, resulting in an increase in the oscillation threshold. In order to avoid this problem, the lower cladding layer 32 having a band gap energy larger than that of the active layer 34 and an adequate thickness (about 1 μm) must be interposed between the active layer and the substrate.

On the other hand, when crystal growth is carried out on the stripe-shaped ridge having a trapezoidal cross-section, contrary to the crystal growth in the stripe-shaped groove 11 having a reverse trapezoidal cross section as in the first embodiment, the width of the (100) surface between the off-angle surfaces, i.e., the width of the top surface of the ridge, increases as the crystal growth proceeds. Therefore, when a stripe-shaped ridge having a trapezoidal cross section is formed on a GaAs substrate and adequately thick lower cladding and lower graded cladding layers are grown on the GaAs substrate, the width of the (100) surface of the lower graded cladding layer opposite the top surface of the ridge is too wide to provide a satisfactory quantum effect in the width direction of the active layer. In this second embodiment of the invention, however, the stripe-shaped ridge 41 having a trapezoidal cross section is formed on the lower cladding layer 32 that is grown on the substrate 31, and the thin lower graded cladding layer 33 is grown on the lower cladding layer 32. Therefore, broadening of the width of the grown layer on the top surface of the ridge is suppressed. Further, an adequately thick lower cladding layer is interposed between the active layer and the substrate.

Figure 9:
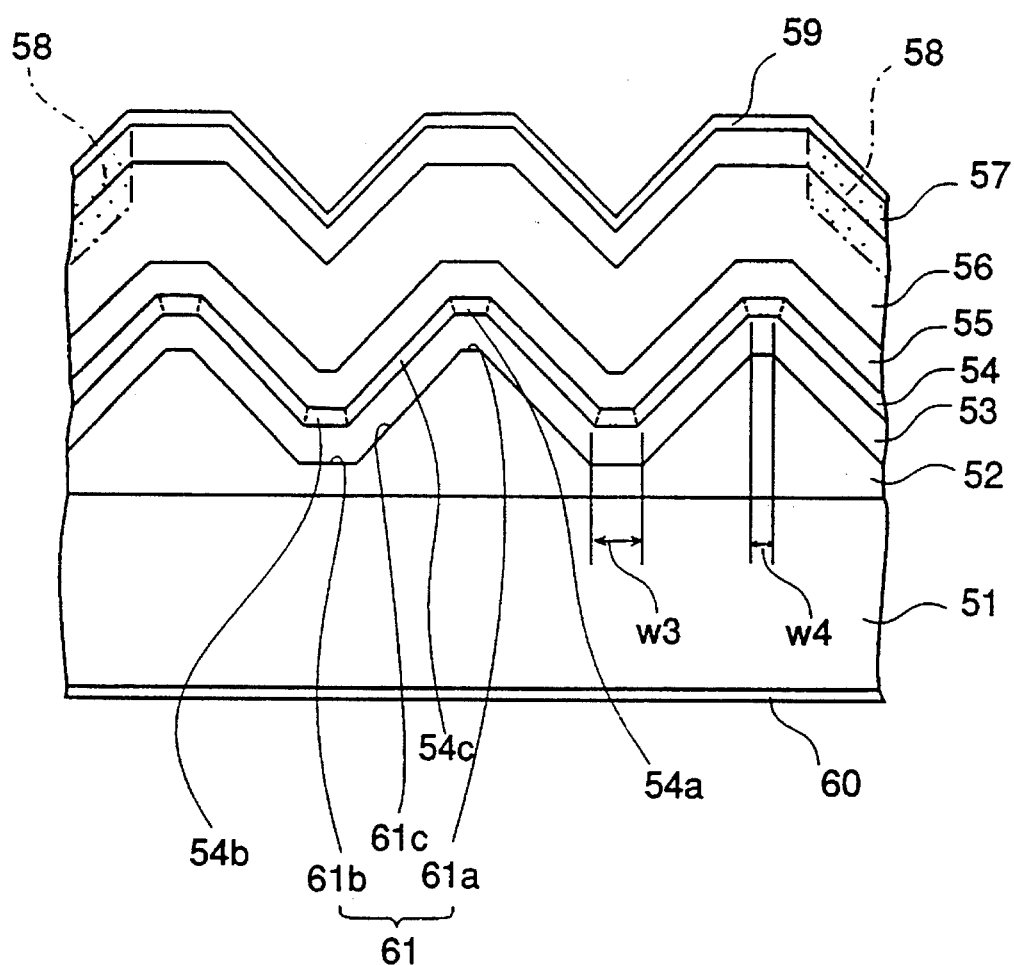
FIG. 9 is a sectional view schematically illustrating a part of a semiconductor laser in accordance with a third embodiment of the present invention.

FIG. 9 is a sectional view schematically illustrating a part of a semiconductor laser in accordance with a third embodiment of the present invention. In the figure, reference numeral 51 designates an n type GaAs substrate having a (100) surface orientation. An n type $(Al_{0.5}Ga_{0.5})_{0.5}In_{0.5}P$ lower cladding layer 52 is disposed on the substrate 51. The lower cladding layer 52 includes a grating 61 comprising a periodic pattern of stripe-shaped ridges and stripe-shaped grooves which are alternatingly arranged in the [011] direction. Reference numeral 61a designates top (100) surfaces of the respective stripe-shaped ridges of the grating 61, numeral 61b designates bottom (100) surfaces of the respective stripe-shaped grooves of the grating, and numeral 61c designates inclined surfaces of the grating. The lower cladding layer 52 is 1 μm thick at the top of the ridge and 0.2 μm thick at the bottom of the groove. An n type $(Al_xGa_{1-x})_{0.5}In_{0.5}P$ lower graded cladding layer 53 is disposed on the lower cladding layer 52, and the al composition ratio x gradually decreases upward from 0.5 to 0.2. A $Ga_{0.5}In_{0.5}P$ active layer 54 of a quantum film structure and having a thickness of 100Å is disposed on the lower graded cladding layer 53. The active layer 54 includes portions 54a grown on the (100) surfaces of the lower graded cladding layer 53 opposite the top surfaces 61a of the stripe-shaped ridges of the grating 61, portions 54b grown on the (100) surfaces of the lower graded cladding layer 53 opposite the bottom surfaces 61b of the respective grooves of the grating 61, and portions 54c grown on the inclined surfaces of the lower graded cladding layer 53 opposite the inclined surfaces 61c of the grating 61. A p type $(Al_xGa_{1-x})_{0.5}In_{0.5}P$ upper cladding layer 55 having a thickness of 0.2 μm is disposed on the active layer 54, and the Al composition ratio x gradually increases upwards from 0.2 to 0.5. A p type $(Al_{0.5}Ga_{0.5})_{0.5}In_{0.5}P$ upper cladding layer 56 is disposed on the upper graded cladding layer 55. A p type GaAs contact layer 57 having a thickness of 0.2 μm is disposed on the upper cladding layer 56. A p side electrode 59 is disposed on the contact layer 57, and an n side electrode 60 is disposed on the rear surface of the substrate 51. Reference numeral 58 designates current blocking regions produced by proton implantation.

A description is given of the production process.

Initially, the lower cladding layer 32 having a thickness of 1 μm is grown on the (100) surface of the n type GaAs substrate 51. Thereafter, a plurality of stripe-shaped masks, each extending in the [01$\bar{1}$] direction, are formed on the lower cladding layer 52. Then, the lower cladding layer 52 is etched with an etchant comprising $H_2SO_4$:$H_2O$ (volume ratio=1:1) to form the grating 61 comprising the periodic pattern of stripe-shaped ridges and stripe-shaped grooves alternatingly arranged in the [011] direction. After removal of the mask pattern, the lower graded cladding layer 53, the active layer 54, the upper graded cladding layer 55, the upper cladding layer 56, and the contact layer 57 are successively grown on the lower cladding layer 52. As the crystal growth proceeds, the width of the bottom surface in the groove of the grating gradually decreases while the width of the top surface of the ridge of the grating gradually increases. Therefore, in order to make the width of the active layer 54b grown opposite the bottom surface 61b of the groove equal to the width of the active layer 54a grown opposite the top surface 61a of the ridge, the width w3 of the bottom (100) surface of the groove must be larger than the width w4 of the top (100) surface of the ridge.

Thereafter, a mask pattern is formed on a part of the contact layer 57 opposite a region where a current path is produced, and protons are implanted from the surface of the contact layer 57 to form the current blocking regions 58. After removal of the mask pattern, the p side electrode 59 is formed on the contact layer 57 and the n side electrode 60 is formed on the rear surface of the substrate 51, followed by cleaving to produce resonator facets, whereby the semiconductor laser shown in FIG. 9 is completed.

Also in this third embodiment of the present invention, the active layer 54a opposite the top (100) surface 61a of the stripe-shaped ridge of the grating and the active layer 54b opposite the bottom (100) surface 61b of the stripe-shaped groove of the grating are in the order state, and the active layer 54c on the inclined surface 61c of the grating is in the disordered state, so that the carrier confinement effect in the transverse direction of the active layer is improved as in the above-described first and second embodiments, resulting in quantum wires with improved quantum effect.

Furthermore, the lower cladding layer 52 includes the grating 61 comprising stripe-shaped ridges and grooves which are alternatingly arranged in the [011] direction, and the quantum wires are produced opposite the top surfaces 61a and the bottom surfaces 61b of the ridges and the grooves of the grating, respectively. Therefore, highly-integrated quantum wires are realized.

Figure 10:
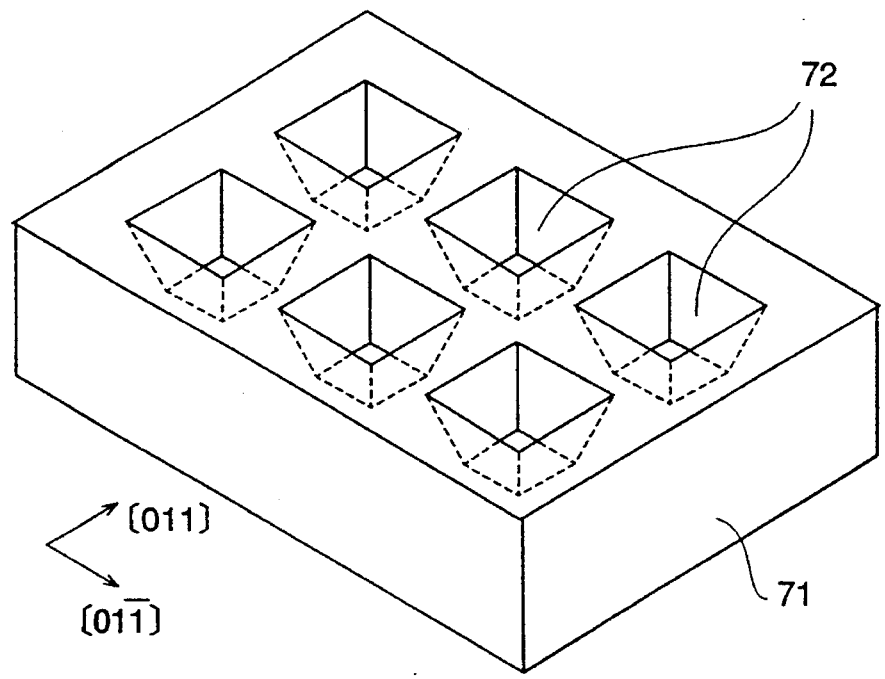
FIG. 10 is a perspective view for explaining a semiconductor laser in accordance with a fourth embodiment of the present invention.

FIG. 10 is a perspective view for explaining a semiconductor laser in accordance with a fourth embodiment of the present invention. In the figure, reference numeral 71 designates an n type GaAs substrate having a (100) surface orientation and a plurality of recesses 72. Each recess 72 is shaped like a reversed and truncated pyramid, and each of four inclined planes of the recess 72 forms an angle of 45° with the (100) surface. The area of the bottom surface of the recess 72 is about 1 μm×1 μm.

In production, as in the above-described first embodiment, a lower cladding layer, a lower graded cladding layer, an active layer, an upper graded cladding layer, an upper cladding layer, and a contact layer are successively grown on the substrate 71 shown in FIG. 10.

In the above-described IEEE Journal of Quantum Electronics, Vol. 27, No. 6, the direction of the inclination of the off-angle surface is limited to the [011] direction. The growth of the GaInP layer in the disordered state on the off-angle surface is caused by the terraced off-angle surface, as seen at atomic layer level, and the periodicity of the atomic arrangement in the GaInP layer grown on the off-angle surface is disordered. Therefore, the crystal growth in the disordered state should occur regardless of the direction of inclination of the off-angle surface.

When the successive crystal growth as in the above-described first embodiment is carried out on the substrate 71 shown in FIG. 10, the InGaP active layer is grown in the ordered state on the bottom surfaces of the respective recesses 72 while it is grown in the disordered state on the inclined surfaces of the recesses 72. Therefore, the active layer grown on the bottom surface of the recess 72 is sandwiched between the upper and lower cladding layers having relatively large band gap energies, to perpendicular the substrate. Further, it is surrounded by the active layers grown in the disordered state and having relatively large band gap energies, with respect to the four sides of the pyramid shape. As the result, quantum boxes with improved quantum effect are achieved.

The reversed pyramid shaped recesses 72 are produced in the following process. Initially, a mask having a plurality of square openings is formed on the substrate 71. Each square opening has a side extending in the [011] direction and a side extending in the [01$\bar{1}$] direction. Then, the substrate 71 is etched with an etchant comprising, for example, $H_2SO_4$: $H_2O_2$ (30 mol %):$H_2O$ (volume ratio=8:1:1) having no surface orientation dependency.

While in the above-described fourth embodiment the recess 72 is shaped like a reversed and truncated quadrangular pyramid, the recess 72 may be shaped like other reversed and truncated polygonal pyramids, such as reversed and truncated triangular or pentagonal pyramid. Alternatively, the recess may be shaped like a reversed and truncated cone.

Figure 11:
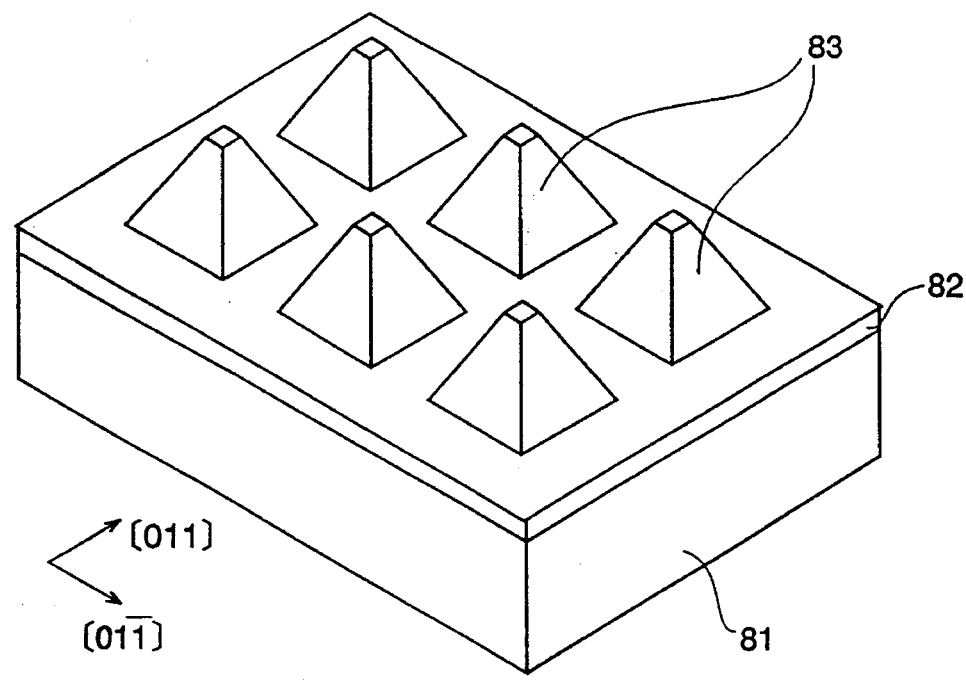
FIG. 11 is a perspective view for explaining a semiconductor laser in accordance with a fifth embodiment of the present invention.
Figure 12:
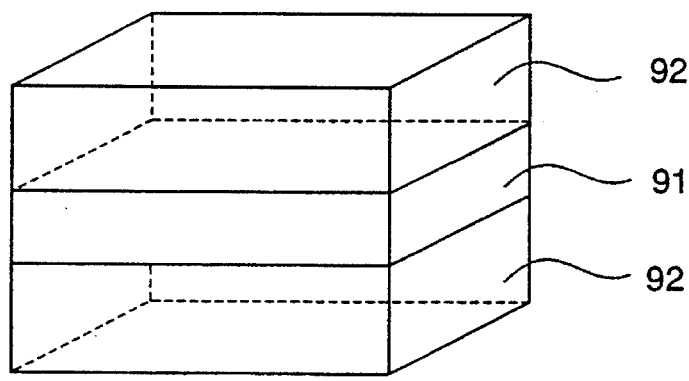
FIG. 12 is a perspective view illustrating a bulk active layer.
Figure 13:
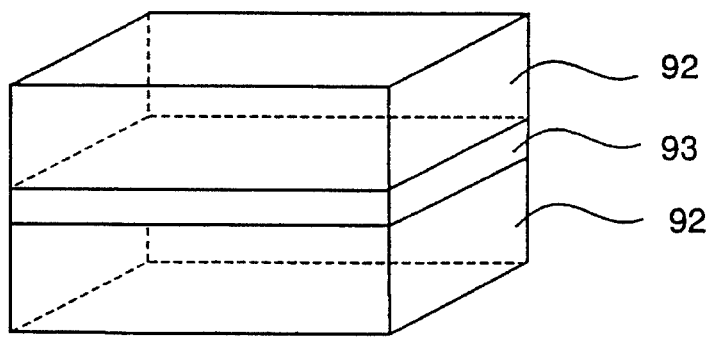
FIG. 13 is a perspective view illustrating a quantum film active layer.
Figure 14:
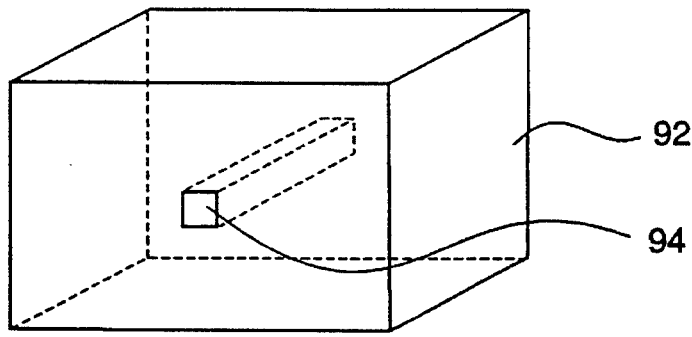
FIG. 14 is a perspective view illustrating a quantum wire active layer.
Figure 15:
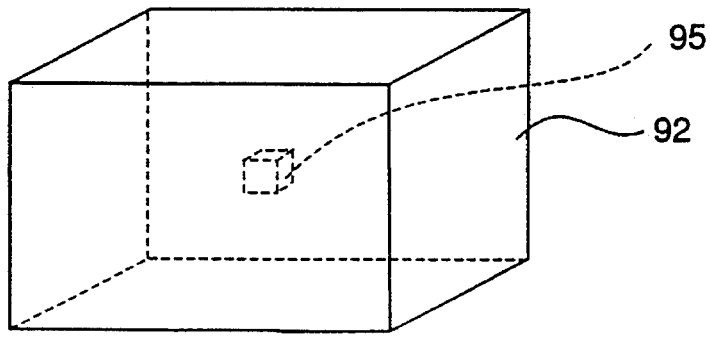
FIG. 15 is a perspective view illustrating a quantum box active layer.
Figure 16:
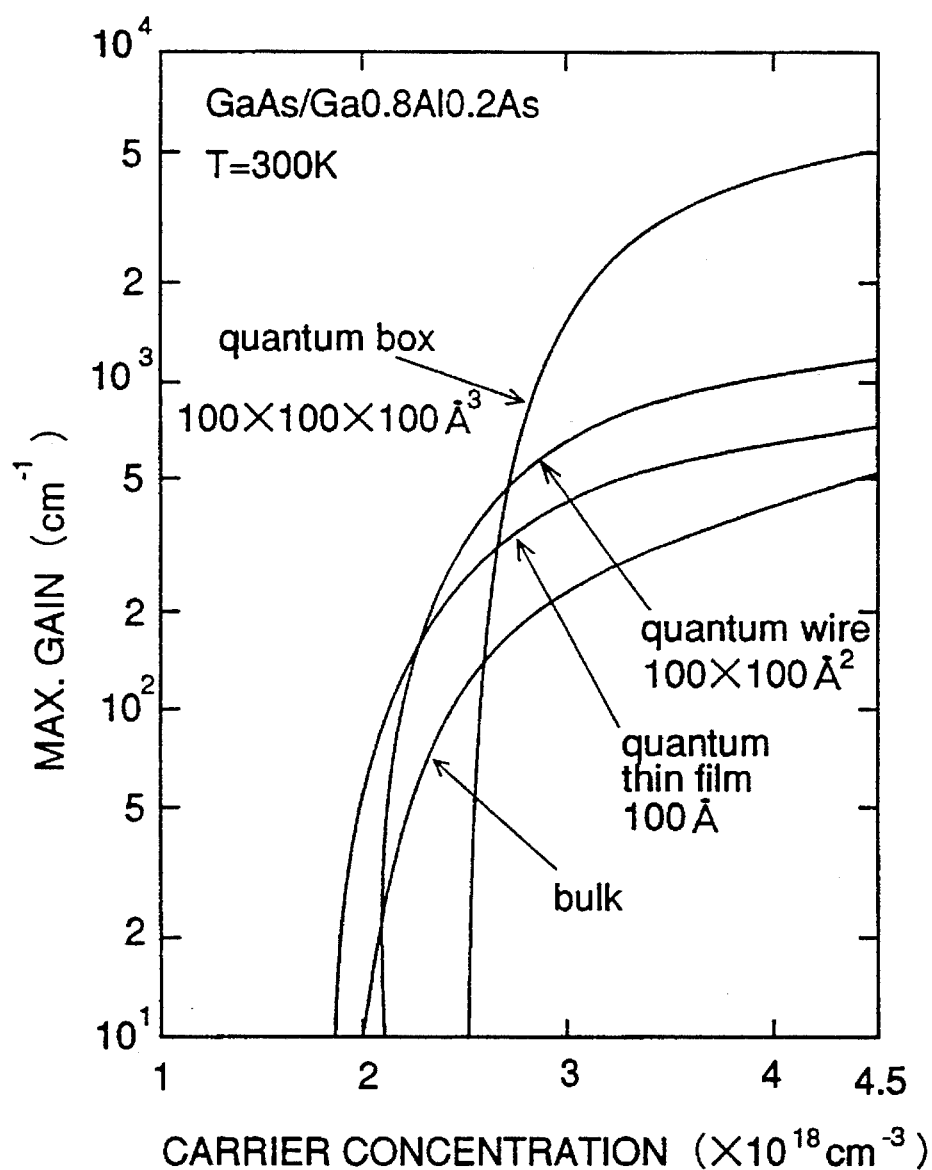
FIG. 16 is a Graph for explaining quantum effects due to the quantum film structure, the quantum wire structure, and the quantum box structure.
Figure 17:
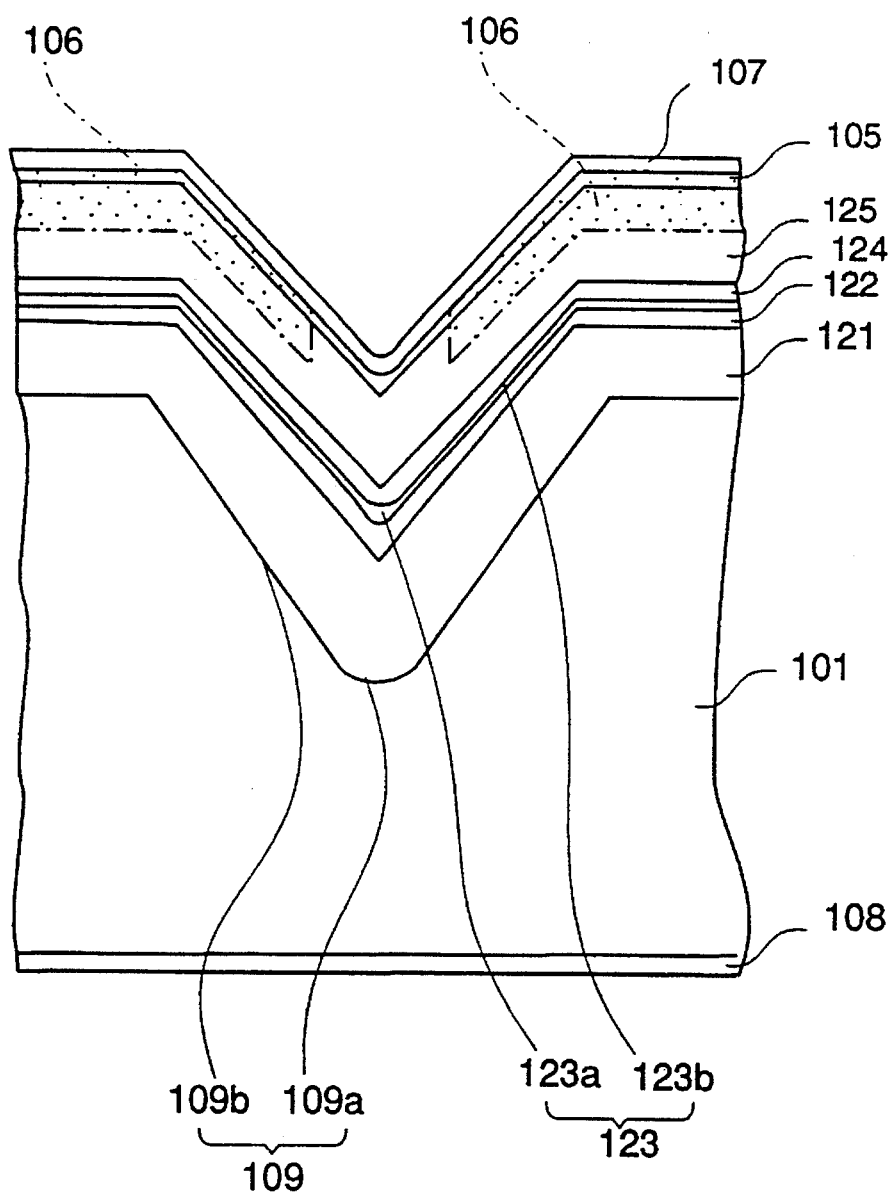
FIG. 17 is a sectional view illustrating a part of a semiconductor laser including a quantum wire structure according to the prior art.

FIG. 11 is a perspective view illustrating a semiconductor laser in accordance with a fifth embodiment of the present invention. In the figure, reference numeral 81 designates an n type GaAs substrate having a (100) surface orientation. An n type $(Al_{0.5}Ga_{0.5})_{0.5}In_{0.5}P$ lower cladding layer 82 is disposed on the GaAs substrate 81. The lower cladding layer 82 includes a plurality ridges 83 shaped like truncated quadrangular pyramids. These ridges 83 are formed by etching.

In production, as in the above-described second embodiment of the invention, a lower graded cladding layer, an active layer, an upper graded cladding layer, an upper cladding layer, and a contact layer are successively grown on the lower cladding layer 82.

When the successive crystal growth as in the second embodiment is carried out on the lower cladding layer 82 shown in FIG. 11, portions of the InGaP active layer grown on the top surfaces of the respective ridges 83 are in the ordered state while portions grown on the inclined surfaces of the ridges are in the disordered state. Therefore, in this fifth embodiment, the active layer at the top of the ridge is sandwiched between the upper and lower cladding layers having relatively large band gap energies and surrounded by the active layers grown in the disordered state and having relatively large band gap energies. As the result, quantum boxes with improved quantum effect are achieved.

While in the above-described fifth embodiment the recess 72 is shaped like a truncated quadrangular pyramid, it may be shaped like other truncated polygonal pyramids, such as a truncated triangular or pentagonal pyramid. Alternatively, the recess may be shaped like a truncated cone.

In the above-described first to fifth embodiments the substrate 1 has a (100) surface orientation, i.e., the off angle of the surface of the substrate with the (100) surface is 0°, and portions of the active layer grown on the (100) surface provide the quantum wire or quantum box structure. However, even when the surface of the substrate 1 forms a small angle with the (100) surface, if this angle is sufficiently smaller than the angle between the (100) surface and the inclined surface of the groove, ridge, or recess, the difference in disordering degrees between the GaInP layer grown on the flat surface and the GaInP layer grown on the inclined surface is sufficiently large, so that the same effects as described above are achieved.

While in the above-described first to fifth embodiments the active layer comprises $Ga_{0.5}In_{0.5}P$, the active layer may comprise GaInP with a composition ratio of GaP:InP different from $Ga_{0.5}In_{0.5}P$, i.e., a strained active layer may be employed.

Further, as shown in FIG. 6, the increase in the band gap energy of the grown semiconductor layer due to the increase in the off angle of the substrate from the (100) surface is obtained not only in GaInP but also in alGaInP. Therefore, the active layer may comprise alGaInP.

While in the above-described first to fifth embodiments the cladding layer comprises $(Al_{0.5}Ga_{0.5})_{0.5}In_{0.5}P$ and the graded cladding layer comprises $(Al_xGa_{1-x})_{0.5}In_{0.5}P$ wherein the Al composition ratios x gradually varies from 0.5 to 0.2 or from 0.2 to 0.5, the composition ratio of these cladding layers are not restricted thereto.

Further, although the cladding layer and the graded cladding layer according to the above-described embodiments comprise alGaInP, these layers may comprise other AlGaAs system materials.

Further, although the semiconductor laser according to the above-described embodiments includes a single active layer, a plurality of active layers with thin intermediate barrier layers may be employed.

What is claimed is:

1. A semiconductor laser comprising:

a semiconductor substrate having a first conductivity type and having opposite front and rear surfaces;

a semiconductor layer having a band gap energy and the first conductivity type disposed on the front surface of the semiconductor substrate and having a first surface in a first crystal plane for providing a quantum wire structure in an active layer grown thereon and second surfaces in second crystal planes disposed at opposite sides of the first surface, the first crystal plane forming a first angle with a {100} surface of the semiconductor substrate and the second crystal plane forming a second angle, larger than the first angle, with the {100} surface;

an active layer comprising a thin film of one of GaInP and alGaInP and having a band gap energy smaller than the band gap energy of the first conductivity type semiconductor layer, the active layer having regularly ordered atoms opposite the first surface in a stripe shape width not wider than 20 nanometers and disordered atoms opposite the second surfaces;

a semiconductor layer of a second conductivity type, opposite the first conductivity type, disposed on the active layer and having a band gap energy larger than the band gap energy of the active layer where a quantum wire structure is formed in the active layer; and first and second electrodes disposed on the rear surface of the substrate and the second conductivity type semiconductor layer, respectively.

2. The semiconductor laser of claim 1 wherein the first conductivity type semiconductor layer includes a stripe-shaped groove having a reverse trapezoidal cross-section, a bottom surface corresponding to the first surface the semiconductor layer, and side surfaces corresponding to the second surfaces of the semiconductor layer.

3. The semiconductor laser of claim 1 wherein the first conductivity type semiconductor layer includes a stripe-shaped ridge having a trapezoidal cross-section, a top surface corresponding to the first surface of the semiconductor layer, and side surfaces corresponding to the second surfaces of the semiconductor layer.

4. The semiconductor laser of claim 1 wherein the first conductivity type semiconductor layer includes a grating comprising a plurality of stripe-shaped grooves, each groove having a reverse trapezoidal cross-section, a bottom surface corresponding to the first surface of the semi-conductor layer, and side surfaces corresponding to the second surfaces of the semi-conductor layer and a plurality of stripe-shaped ridges, each ridge having a trapezoidal cross-section, a top surface corresponding to the first surface of the semiconductor layer, and side surfaces corresponding to the second surfaces of the semiconductor layer, the grooves and ridges being alternatingly arranged.

5. A semiconductor laser comprising:

a semiconductor substrate having a first conductivity type and having opposite front and rear surfaces;

a semiconductor layer having a band gap energy and the first conductivity type disposed on the front surface of the semiconductor substrate and having a first surface in a first crystal plane for providing a quantum box structure in an active layer grown thereon and second surfaces in second crystal planes surrounding the first crystal plane, the first crystal plane forming a first angle with a {100} surface of the semiconductor substrate and the second crystal plane forming a second angle, larger than the first angle, with the {100} surface;

an active layer comprising a thin film of one of GaInP and alGaInP and having a band gap energy smaller than the band gap energy of the first conductivity type semiconductor layer, the active layer having regularly ordered atoms opposite the first surface and having dimensions in each of two orthogonal directions of less than 20 nanometers and disordered atoms opposite the second surfaces;

a semiconductor layer of a second conductivity type, opposite the first conductivity type, disposed on the active layer and having a band gap energy larger than the band gap energy of the active layer whereby a quantum box structure is formed in the active layer; and first and second electrodes disposed on the rear surface of the substrate and the second conductivity type semiconductor layer, respectively.

6. The semiconductor laser of claim 5 wherein the first conductivity type semiconductor layer includes a recess having a trapezoidal cross-section, a bottom surface corresponding to the first surface of the semiconductor layer, and side surfaces corresponding to the second surfaces of the semiconductor layer.

7. The semiconductor laser of claim 5 wherein the first conductivity type semiconductor layer includes a ridge having a trapezoidal cross-section, a top surface corresponding to the first surface of the semiconductor layer, and side surfaces corresponding to the second surfaces of the semiconductor layer.

8. A method for producing a semiconductor laser comprising:

preparing a semiconductor substrate having a first conductivity type and having opposite front and rear surfaces;

forming a semiconductor layer having a band gap energy and the first conductivity type on the front surface of the semiconductor substrate so that the semiconductor layer has a stripe-shaped first surface in a first crystal plane forming a first angle with a {100} surface of the semiconductor substrate and stripe-shaped second surfaces in second crystal planes disposed at opposite sides of the first surface and forming a second angle, larger than the first angle, with the {100} surface;

growing an active layer comprising one of GaInP and alGaInP and having a band gap energy smaller than the band gap energy of the first conductivity type semiconductor layer on the first conductivity type semiconductor layer under prescribed growth conditions that produce in the active layer an or state wherein atoms of the active layer are regularly ordered in a stripe shape having a width less than 20 nanometers opposite the first surface and a disordered state opposite the second surfaces of the semiconductor layer;

growing a semiconductor layer of a second conductivity type, opposite the first conductivity type, and having a band gap energy larger than the band gap energy of the active layer on the active layer whereby a quantum wire structure is formed in the active layer; and forming first and second electrodes disposed on the rear surface of the substrate and the second conductivity type semiconductor layer, respectively.

9. The method of claim 8 including forming the first conductivity type semiconductor layer with a stripe-shaped groove having a reverse trapezoidan cross-section, a bottom surface corresponding to the first surface of the semiconductor layer, and side surfaces corresponding to the second surfaces the semiconductor layer.

10. The method of claim 8 including forming the first conductivity type semiconductor layer with a stripe-shaped ridge having a trapezoidal cross-section, a top surface corresponding to the first surface of the semiconductor layer, and side surfaces corresponding to the second surfaces of the semiconductor layer.

11. The method of claim 8 including forming the first conductivity type semiconductor layer with a grating comprising a plurality of stripe-shaped grooves, each groove having a reverse trapezoidal cross-section, a bottom surface corresponding to the first surface of the semiconductor layer, and side surfaces corresponding to the second surfaces of the semiconductor layer and a plurality of stripe-shaped ridges, each ridge having a trapezoidal cross-section, a top surface corresponding to the first surface of the semiconductor layer, and side surfaces corresponding to the second surfaces of the semiconductor layer, the grooves and ridges being alternatingly arranged.

12. A method for producing a semiconductor laser comprising:

preparing a semiconductor substrate having a first conductivity type and having opposite front and rear surfaces;

forming a semiconductor layer having a band gap energy and the first conductivity type on the front surface of the semiconductor substrate so that the semiconductor layer has a first surface of crystal plane forming a first angle with a {100} surface of the semiconductor substrate and second surfaces in second crystal planes surrounding the first surface and forming a second angle larger than the first angle with the {100} surface;

growing an active layer comprising one of GaInP and alGaInP and having a band gap energy smaller than the band gap energy of the first conductivity type semiconductor layer on the first conductivity type semiconductor layer under prescribed growth conditions that produce in the active layer an ordered state wherein atoms of the active layer are regularly ordered in each of of two orthogonal directions of less than 20 nanometers opposite the first surface and a disordered state the active layer grown on opposite the second surfaces;

growing a semiconductor layer of a second conductivity type, opposite the first conductivity type, and having a band gap energy larger than the band gap energy of the active layer on the active layer whereby a quantum box structure is formed in the active layer; and forming first and second electrodes disposed on the rear surface of the substrate and the second conductivity type semiconductor layer, respectively.

13. The method of claim 12 including forming the first conductivity type semiconductor layer with a recess having a trapezoidal cross-section, a bottom surface corresponding to the first surface of the semiconductor layer, and side surfaces corresponding to the second surfaces of the semiconductor layer.

14. The method of claim 12 including forming the first conductivity type semiconductor layer with a ridge having a trapezoidal cross-section, a top surface corresponding to the first surface of the semiconductor layer, and side surfaces corresponding to the second surfaces of the semiconductor layer.

* * * * *

UNITED STATES PATENT AND TRADEMARK OFFICE
CERTIFICATE OF CORRECTION

PATENT NO. : 5,528,615        Page 1 of 2
DATED     : June 18, 1996
INVENTOR(S) : Shima It is certified that error appears in the above-indentified patent and that said Letters Patent is hereby corrected as shown below:

Column 13, Line 31, change "alGaInP" to --AlGaInP--;

Line 41, change "where" to --whereby--;

Line 50, after "surface" (2nd occurrence) insert --of--;

Line 63, change "semi-conductor" to --semiconductor--;

Line 65, change "semi-conductor" to --semiconductor--;

Column 14, Line 18, change "alGaInP" to --AlGaInP--;

Line 61, change "alGaInP" to --AlGaInP--;

Line 65, change "or" to --ordered--;

Column 16, Line 4, change "of" to --in a first--;

Line 10, change "alGaInP" to --AlGaInP--;

Line 16, delete "of" (second occurrence);

UNITED STATES PATENT AND TRADEMARK OFFICE
CERTIFICATE OF CORRECTION

PATENT NO. : 5,528,615
DATED : June 18, 1996
INVENTOR(S) : Shima

It is certified that error appears in the above-indentified patent and that said Letters Patent is hereby corrected as shown below:

Column 16, lines 17 & 18, delete "the active layer grown on".

Signed and Sealed this

Eighth Day of October, 1996

Attest:

BRUCE LEHMAN

Attesting Officer

Commissioner of Patents and Trademarks